(12) United States Patent
Burkman

(10) Patent No.: US 10,725,106 B2
(45) Date of Patent: Jul. 28, 2020

(54) CONTACTOR DIAGNOSTIC SYSTEM AND METHOD

(71) Applicant: Ford Global Technologies, LLC, Dearborn, MI (US)

(72) Inventor: Wesley Edward Burkman, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 92 days.

(21) Appl. No.: 16/164,216

(22) Filed: Oct. 18, 2018

(65) Prior Publication Data

US 2020/0124671 A1 Apr. 23, 2020

(51) Int. Cl.
*G01R 31/327* (2006.01)
(52) U.S. Cl.
CPC .................. *G01R 31/3277* (2013.01)
(58) Field of Classification Search
CPC .............. G01R 31/006; G01R 31/3277; G01R 31/3275; G01R 31/3278
See application file for complete search history.

(56) References Cited

U.S. PATENT DOCUMENTS 8,901,934 B2  12/2014  Namou et al.
2012/0105065 A1*  5/2012  Namou .............. G01R 31/3275
                                                                        324/415

FOREIGN PATENT DOCUMENTS

CN       206441672 U    8/2017
DE    102006050529 A1   4/2008

* cited by examiner

*Primary Examiner* — Jay Patidar
(74) *Attorney, Agent, or Firm* — David B. Kelley; Brooks Kushman P.C.

(57) ABSTRACT

A contactor assembly including a housing, an accessible contactor assembly component, a contact bar, and a module is provided. The accessible contactor assembly component may be disposed within the housing. The contact bar may be electrically connected to the accessible contactor assembly component and translatable between an open and a closed position. The module may be programmed to identify whether the contact bar is in the open or closed position based on detected voltage of the accessible contactor assembly component. The assembly may further include a pair of coil terminals, a pair of power terminals, and a diagnostic terminal arranged for electrical communication with the accessible contactor assembly component. The module may be further programmed to detect whether the contact bar is in the open or closed position responsive to detection of a voltage status of the diagnostic terminal.

14 Claims, 4 Drawing Sheets

CONTACTOR DIAGNOSTIC SYSTEM AND METHOD

TECHNICAL FIELD

The present disclosure relates to vehicle contactor assemblies and a diagnostic system and method to identify contactor faults.

BACKGROUND

When diagnosing whether a contactor is faulty, a typical method involves measuring a voltage differential across the contactor. For example, a first side of the contactor is measured at a battery side connection and a second side is measured at a load side connection. If a small voltage drop across the contactor or no voltage drop is detected across the contactor, the method identifies the contactor as closed. If there is a large voltage drop across the contactor, the method identifies the contactor as open. To measure that the contactor is open, the load side must be discharged by a load connected to the contactor. Under certain conditions, the load takes too long to discharge, leading the diagnostic module to incorrectly flag the contactor as stuck closed.

SUMMARY

A contactor assembly includes a housing, an accessible contactor assembly component, a contact bar, and a module. The accessible contactor assembly component is disposed within the housing. The contact bar is electrically connected to the accessible contactor assembly component and translatable between an open and a closed position. The module is programmed to identify whether the contact bar is in the open or closed position based on detected voltage of the accessible contactor assembly component.

The assembly may further include a pair of coil terminals, a pair of power terminals, and a diagnostic terminal arranged for electrical communication with the accessible contactor assembly component. The module may be further programmed to detect whether the contact bar is in the open or closed position responsive to detection of a voltage status of the diagnostic terminal. The open position may be further defined as an electrically floating position in which the contact bar does not operate as an electrical conductor and the contact bar is disconnected from the pair of power terminals. The assembly may further include energy transferring power terminals in selective electrical communication with a battery and a load. The contact bar may include a first connection region and a second connection region, each of the connection regions disposed on opposing ends of the contact bar to transfer current from the battery to the load when the contact bar is in the closed position. The contact bar and the accessible contactor assembly component may be arranged with one another such that the module detects actual contact bar voltage status as to whether the contact bar is in the open or closed position regardless of a load side voltage. The assembly may further include a pull-down resistor mounted for electrical communication with the contact bar. The accessible contactor assembly component may be one of a frame disposed within the housing, a shaft to translate the contact bar between the open and closed positions, a movable core, or a collar.

A vehicle contactor assembly includes a housing, a frame, a coil, first and second terminals, third and fourth terminals, a translation unit, a contact bar, and a diagnostic module. The frame is disposed within the housing. The coil is disposed within the frame. The first and second terminals extend out of the housing for selective electrical communication with the coil. The third and fourth terminals extend out of the housing for selective electrical communication with a battery and a load. The translation unit is disposed within and in electrical communication with the frame. The contact bar is mounted to the translation unit and oriented within the frame such that the contact bar translates between a first position in which the contact bar does not contact the third and fourth terminals and a second position in which the contact bar does contact the third and fourth terminals. The diagnostic module is programmed to identify whether the contact bar is in the first position or the second position regardless of a discharge level of a load of a circuit including the third and fourth terminals of a load side.

The assembly may further include a fifth terminal extending from within the housing and in electrical communication with the frame. The frame may be in electrical communication with the translation unit such that the fifth terminal and the contact bar have a same voltage. The diagnostic module may be in electrical communication with the frame and may be further programmed to identify whether the contact bar is in the first position or the second position based on a voltage status of the frame. The assembly may further include a pull-down or pull-up resistor for electrical communication with the contact bar. The pull-down resistor may be in electrical communication with the contact bar and a ground potential of the battery or a series of battery cells. The pull-down or pull-up resistor may be in electrical communication with the contact bar and an intermediate potential of a series of battery cells. The contact bar may include first and second contact regions each disposed on one of two opposing ends of the contact bar. The translation unit may be oriented within the frame such that the first contact region and the second contact region do not contact the third and fourth terminals when the contact bar is in the first position and both contact the third and fourth terminals when the contact bar is in the second position. The assembly may further include a pull-down resistor in electrical communication with the contact bar to selectively reduce a voltage of the contact bar to a voltage equal to approximately half of a voltage of a battery in at least partial electrical communication with the contact bar.

A method to diagnose a contactor status includes orienting a moveable contact bar within a contactor assembly for electrical communication with an accessible contactor assembly component of the contactor assembly; orienting a diagnostic module for electrical communication with the accessible contactor assembly component; and directly measuring a voltage of the accessible contactor assembly component to identify whether the contact bar is in an open position or a closed position in which a circuit including the contact bar is complete.

The accessible contactor assembly component may be a diagnostic terminal, a frame disposed within a housing, a movable core, a collar, or a translation unit supporting the contact bar. The accessible contactor assembly component may be a frame, and the method may further include electrically connecting a diagnostic terminal to the frame such that the diagnostic module may directly measure the voltage of the diagnostic terminal to identify whether the contact bar is in the open position or the closed position. The method may further include arranging a pull-down resistor in electrical communication with the contact bar to selectively reduce a voltage of the contact bar to a voltage equal to approximately half of a voltage of the battery.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present disclosure. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be used in particular applications or implementations.

Figure 1A:
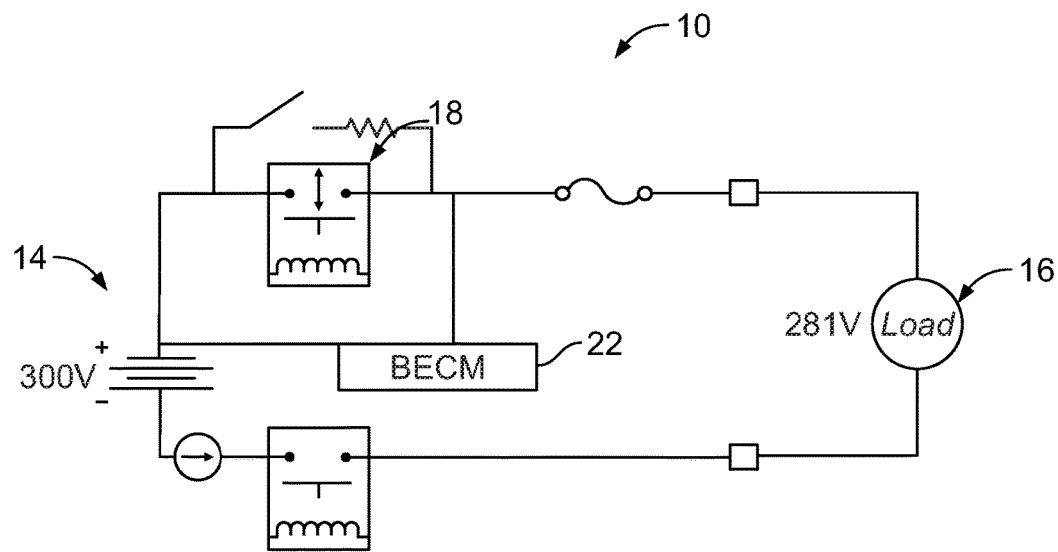
FIG. 1A is a schematic diagram illustrating an example of a prior art relay status detection circuit for a contactor assembly.

FIG. 1A is a schematic diagram illustrating an example of a portion of a prior art circuit for an electrified powertrain assembly, referred to generally as a circuit 10 herein. The circuit 10 includes a battery 14 and a load 16. Voltage is measured across a relay 18 to identify whether the relay 18 is open or closed. For example, a battery electric control module (BECM) 22 may be in electrical communication with the circuit 10 and include electrical links to the relay 18 and the battery 14. The BECM 22 may measure a voltage across the relay 18 to identify whether a contactor of the relay 18 is open or closed. For example, a first voltage is measured at the battery 14 side and a second voltage are measured at the load 16 side. If there is a small amount or no voltage drop across the relay 18, the contactor of the relay 18 is assumed to be closed. If there is a large voltage drop across the relay 18, the contactor of the relay 18 is assumed to be open.

In one example, the BECM 22 may be programmed to indicate that the contactor of the relay 18 is closed if a voltage delta is equal to or less than a predetermined threshold, such as a predetermined threshold of twenty volts. However, the load 16 may need to completely discharge before the BECM 22 may accurately confirm that the relay is not stuck closed. A complete discharge often takes an amount of time in excess of an acceptable time threshold. As a result, the BECM 22 may diagnose contactor status too soon which may lead to the BECM 22 incorrectly identifying the contactor as stuck closed when the contactor is in an open position. In FIG. 1A, a voltage differential between the battery 14 and the load 16 is, for example, 19 volts so the BECM 22 may incorrectly identify the contactor of the relay 18 as closed since in this example, the voltage delta of 19 volts is less than a predetermined threshold of 20 volts. This incorrect identification may be a result of a load not discharging completely or substantially completely or the BECM 22 checking a voltage prematurely.

Figure 1B:
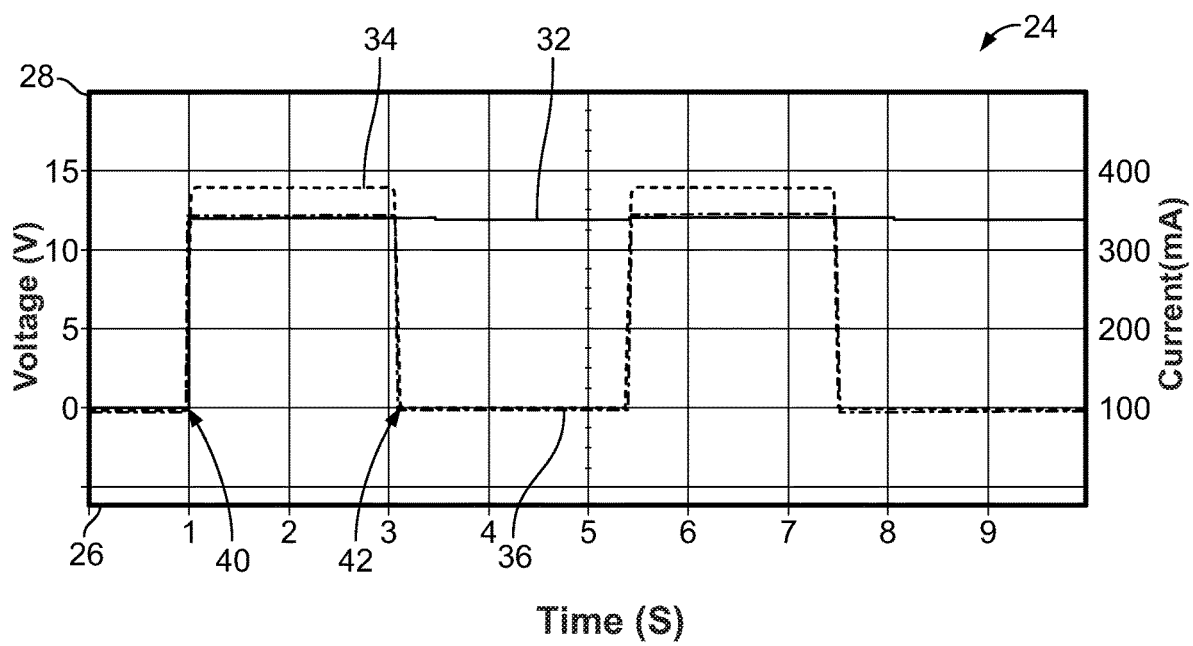
FIG. 1B is a graph illustrating an example of operational component voltages of the circuit of FIG. 1A.

FIG. 1B is a graph illustrating an example of voltage and current flow during operation of the circuit 10, referred to generally as a graph 24 herein. An X-axis 26 represents time. A first Y-axis 28 represents voltage. A second Y-axis 29 represents current. Line 32 represents a load side voltage, line 34 represents a coil current of the relay 18 in circuit 10, and line 36 represents a movable contact bar voltage. The coil current may be representative of a voltage being applied to the relay 18 and generated, for example, by a battery such as a 12V lead acid battery.

At location 40, the coil of the relay 18 in circuit 10 is energized and a contact bar of the relay 18 closes. As such, a load side of the circuit 10 increases as represented by line 32 and a current of the coil increases as represented by line 34. At location 42, the coil of the relay 18 in circuit 10 is de-energized and the contact bar of the relay 18 opens. As a result, the current of the coil decreases to 0 amps, while the voltage across the relay 18 stays high until the load side is discharged. Various scenarios may prevent the load 16 from fully discharging. In an active discharge, a load may begin executing power conversions and consume energy. A passive discharge may occur if the active discharge does not. Due to the load side voltage not completely discharging, the BECM 22 may incorrectly identify the relay 18 as still closed since the BECM 22 is measuring a status of the relay 18 based on the load side voltage in the circuit 10. In another example, the load side voltage may remain substantially constant due to a connection to a capacitor.

Figure 2A:
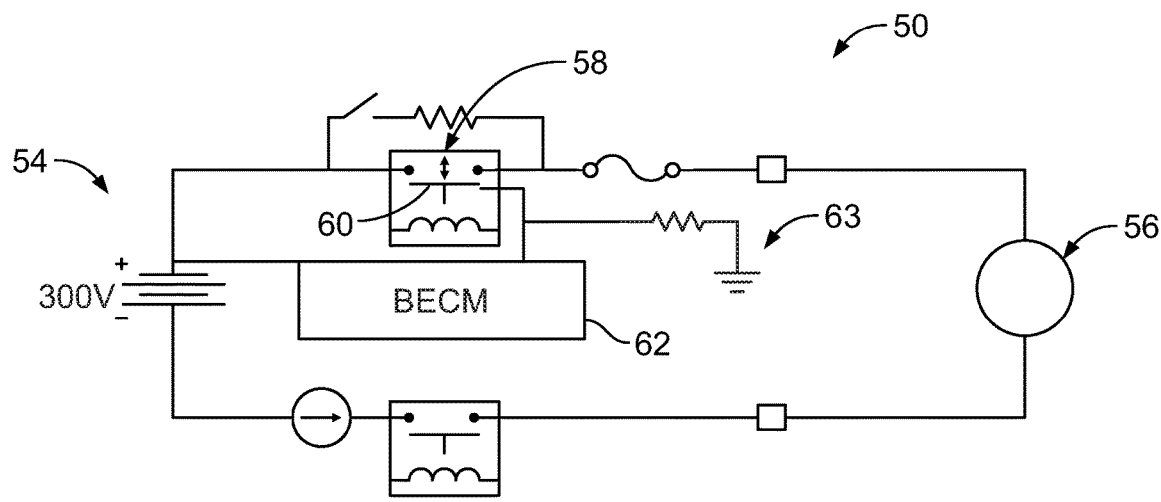
FIG. 2A is a schematic diagram illustrating an example of a relay detection circuit for a contactor assembly.

FIG. 2A is a schematic diagram illustrating an example of a portion of a circuit for an electrified powertrain assembly, referred to generally as a circuit 50 herein. The circuit 50 may include a battery 54 and a load 56. Voltage across a relay 58 may be measured to identify whether a contactor of the relay 58 is open or closed. The relay 58 may include a moveable contact bar 60 arranged to translate between at least a first position and a second position. The first position may be defined as an open position or as a position in which the relay 58 is open and the contact bar 60 is not conducting electrical current (position shown in FIG. 2A). The second position may be defined as a closed position or a position in which the relay 58 is closed and the contact bar 60 is conducting electrical current. A diagnostic module or sense module, such as a BECM 62, may be arranged with the circuit 50 to detect a voltage differential between the battery 54 side and the contact bar 60 to identify whether the contact bar 60 is in the open or closed position regardless of whether the load 16 completely discharges.

When the contact bar 60 is in the first or open position, the contact bar 60 is completely disconnected from the circuit 50 and may be referred to as electrically "floating." This floating node may be pulled down to a battery negative potential after the contact bar 60 opens. The BECM 62 may be programmed to measure a voltage differential between the battery 54 side and the contact bar 60. In contrast to the BECM 22 of the circuit 10, the BECM 62 may directly identify whether the contact bar 60 is open or closed without relying on the load 56 to discharge the load side of the circuit 50.

Optionally, a resistor may be included in the circuit 50 to assist in promoting accurate electrical readings of the circuit 50. A pull-down resistor 63 may be in electrical communication with the relay 58 and a ground of the battery 54 to influence a full battery voltage reading when the contact bar 60 is in the first position. In another example, the pull-down resistor 63 may be in electrical communication with the contact bar 60 to selectively reduce a voltage of the contact bar 60 to a voltage equal to approximately half of a voltage of the battery 54 to provide diagnostic benefits minimizing false relay readings. As another example, a pull-up resistor (not shown) or pull-down resistor may be in electrical communication with the relay 58 to influence a predetermined voltage reading when the contact bar 60 is in the second position. It is also contemplated that the BECM 62 may integrally include a pull-down resistor or a pull-up resistor.

While accessing the contact bar 60 may present design challenges because the contact bar 60 is moveable in the circuit 50, there are non-moving conductive surfaces electrically connected to the contact bar 60 which have a same electrical potential as the contact bar 60 which may be accessed to provide voltage information of the contact bar 60. As such, an accurate reading of a voltage potential of the contact bar 60 may be measured in the circuit 50 by measuring a voltage potential across one of the other conductive surfaces electrically connected to the contact bar 60. For example, an accessible contactor assembly component, such as a frame disposed within a contactor housing, may be electrically connected to the contact bar 60. The BECM 62 may be in electrical communication with the accessible contactor assembly component to identify a voltage reading relating to the contact bar 60 as further described herein.

Figure 2B:
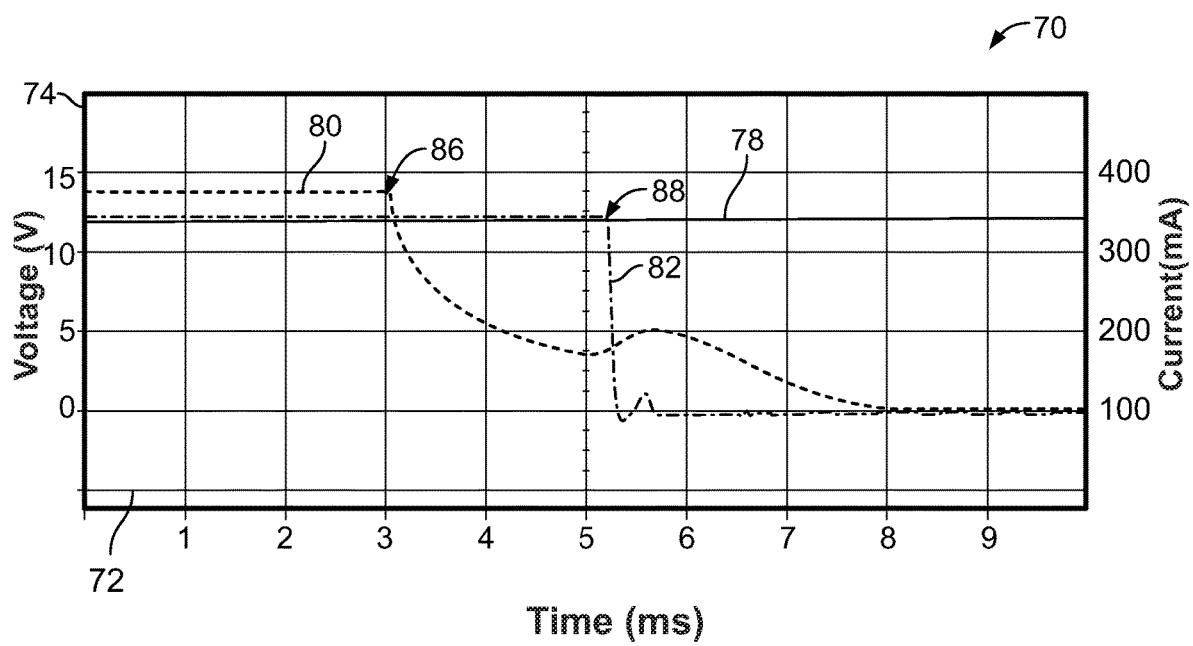
FIG. 2B is a graph illustrating an example of operational component voltages of the circuit of FIG. 2A.

FIG. 2B is a graph illustrating an example of voltage and current flow during operation of the circuit 50, referred to as a graph 70 herein. An X-axis 72 represents time. A first Y-axis 74 represents voltage. A second Y-axis 73 represents current. Line 78 represents a load side voltage of the circuit 50. Line 80 represents a coil current of the relay 58 in circuit 50. The coil current may be representative of a voltage being applied to the circuit 50 generated by, for example, a battery such as a 12V lead acid battery. Line 82 represents a voltage of the contact bar 60 of the circuit 50.

At location 86, the coil of the circuit 50 is de-energized. As shown by line 80, current through the coil decreases and the load side voltage remains substantially the same as shown by line 78. At location 88, the relay 58 is opened as the contact bar 60 goes electrically floating. As a result, the coil current increases slightly and then drops as represented by line 80. The voltage potential of the contact bar 60 changes as shown by line 82. Even though the actual voltage potential of the contact bar 60 has now changed, the load side voltage remains at a level substantially equal to the operating level prior to opening the relay 58 because the load side voltage has not completely discharged. Various scenarios may prevent the load side voltage from fully discharging as mentioned above.

In contrast to a configuration of the circuit 10 in which the BECM 22 is measuring a status of the relay 18 based on the load side voltage of the circuit 10, the BECM 62 of the circuit 50 is measuring an actual voltage potential of the contact bar 60 to identify whether the contact bar 60 is open or closed to prevent inaccurate diagnosis of contact bar 60 status.

Figure 3:
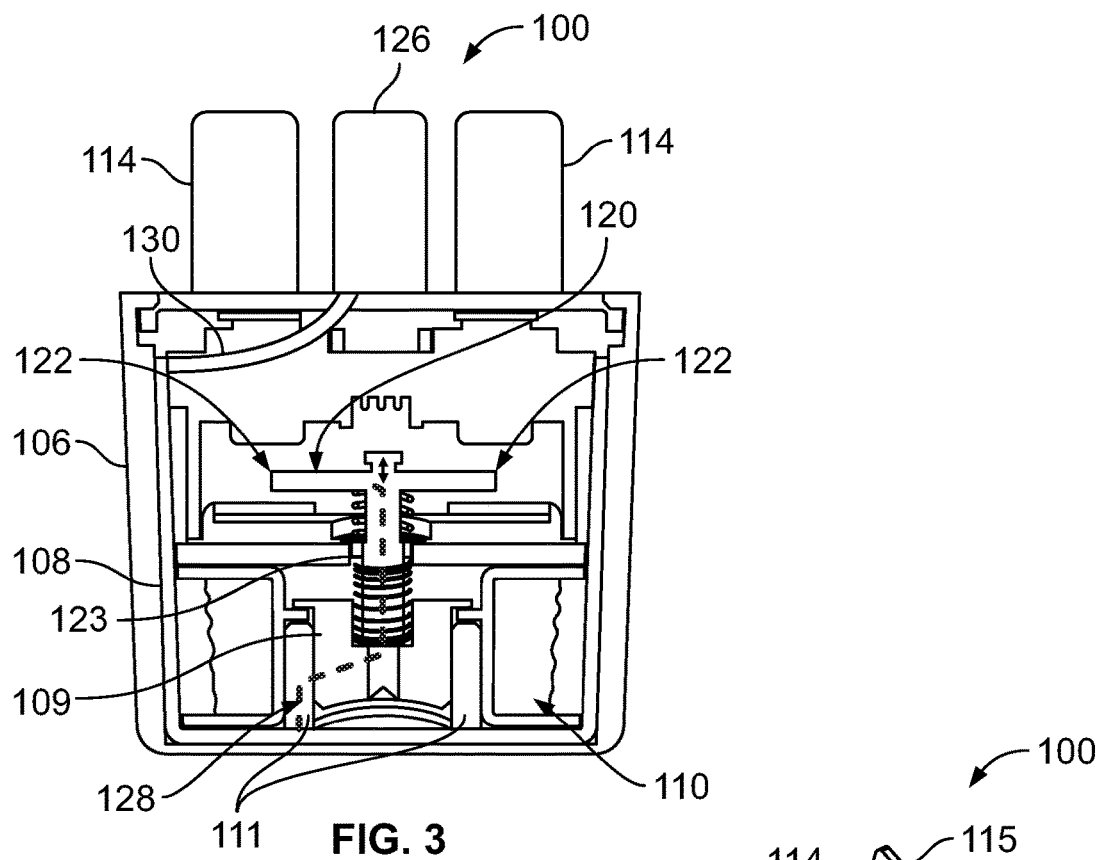
FIG. 3 is a front view, in cross-section, illustrating an example of a portion of a contactor assembly.
Figure 4:
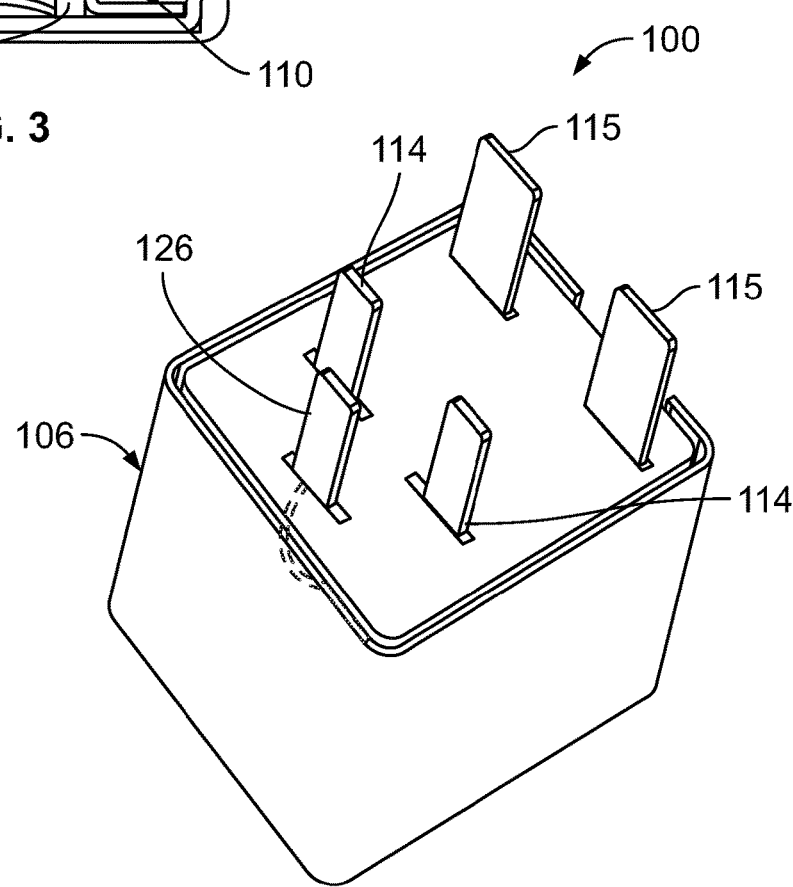
FIG. 4 is a perspective view of the contactor assembly of FIG. 3.

FIGS. 3 and 4 illustrate an example of a contactor assembly including a moveable contact bar of a relay, referred to generally as a contactor assembly 100 herein. FIG. 3 is a cross-sectional view of the contactor assembly 100. FIG. 4 is a perspective view of the contactor assembly 100. The contactor assembly 100 may include components similar to the components as described in relation to the circuit 50.

The contactor assembly 100 may include a housing 106 and a frame 108 disposed therein. A movable core 109, coil 110, and a collar 111 may be disposed within the frame 108. The coil 110 may operate to convert electrical energy to magnetic fields and may be driven by, for example, a 12V battery source. A first pair of terminals 114 may extend out of the housing 106 and may be referred to as coil or control terminals. A second pair of terminals 115 may extend out of the housing 106 and may be referred to as power terminals. The second pair of terminals 115 may be arranged for electrical communication with the battery 54 and load 56 to transfer energy between one another when the contactor assembly 100 is closed. A fifth terminal 126 may be referred to as a diagnostic terminal in electrical communication with a contact bar 120. The fifth terminal 126 may assist in identifying a voltage potential of the contact bar 120 of the contactor assembly 100. The frame 108, the movable core 109, the collar 111, a shaft 123, and the contact bar 120 may be in electrical communication with one another such that a common potential voltage exists across the components.

The contact bar 120 may be mounted within the housing 106 for translation. In one example, the contact bar 120 may be arranged with a translation unit, such as a spring and the shaft 123, to selectively direct the translation of the contact bar 120. The contact bar 120 includes a pair of contact regions 122 at opposing ends of the contact bar 120. The contact bar 120 may be mounted to translate between at least a first position and a second position. The first position may be a position in which each of the pair of contact regions 122 does not contact one of the terminals 114. The first position may also be referred to as an open position in which the contact bar 120 is electrically floating. The second position may be a position in which each of the contact regions 122 contacts a respective terminal of the terminals 114. The second position may also be referred to as a closed position in which the contact bar 120 is assisting in promoting a flow of current through the contactor assembly 100.

The contact bar 120 may be oriented within the housing 106 for electrical communication with the frame 108 such that the contact bar 120 and the frame 108 have the same voltage potential. For example, electrical communication between the frame 108 and the contact bar 120 may be facilitated as illustrated by dashed line 128 in which electrical current may flow from the contact bar 120 through the shaft 123, the movable core 109, the collar 111, and to the frame 108. Additionally, the fifth terminal 126 may be in electrical communication with the contact bar 120. In one example, an electrical connector 130 may extend between the fifth terminal 126 and the frame 108 such that a voltage potential of the contact bar 120 may be identified by measuring a voltage of the fifth terminal 126.

Figure 5:
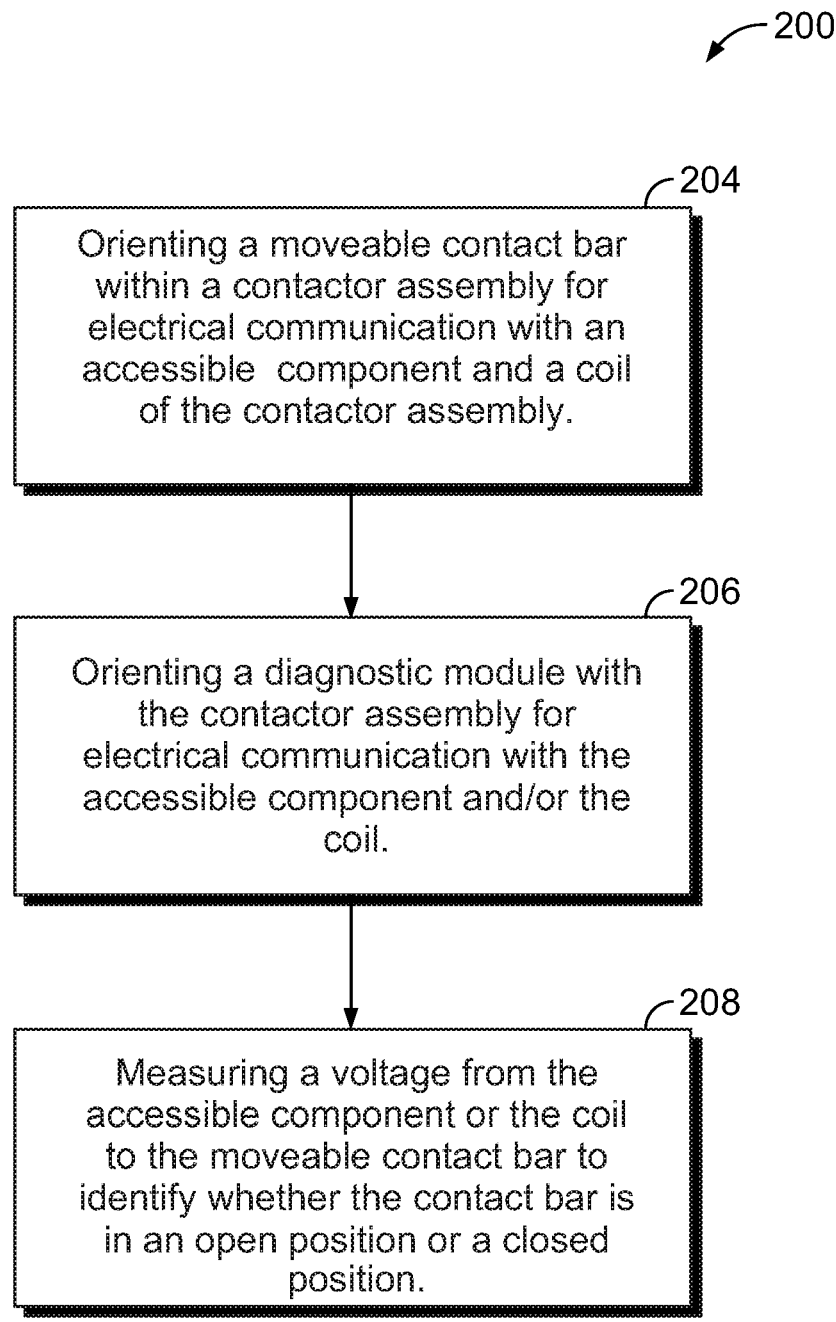
FIG. 5 is a flow chart illustrating an example of a diagnostic strategy to diagnose a contactor status.

FIG. 5 is a flow chart illustrating an example of a diagnostic strategy for a contactor assembly, referred to generally as a diagnostic strategy 200 herein. In operation 204, a contactor of the contactor assembly, such as the contact bar 120, may be arranged within the contactor assembly for electrical communication with an accessible contactor assembly component, such as the coil 110.

The contact bar may be mounted for translation within the contactor assembly to move between an open position and a closed position. When in the open position, the contact bar may be described as electrically floating and an electrical circuit of the contactor assembly is not complete. When in the closed position, the contact bar may complete the electrical circuit of the contactor assembly.

The accessible contactor assembly component may be a component that is accessible by a diagnostic module, such as the BECM 62 or a voltage measuring device, to identify a voltage potential of the contact bar. In one example, the accessible contactor assembly component may be a frame, such as the frame 108, electrically connected to the contact bar and disposed within a contactor assembly housing, such as the housing 106. In another example, the accessible contactor assembly component may be a terminal, such as the fifth terminal 126, in electrical communication with the contact bar.

In operation 206, the diagnostic module may be oriented with the contactor assembly for electrical communication with the accessible contactor assembly component. The contactor assembly may be included within an electrified powertrain of a vehicle. The diagnostic module may utilize this electrical communication to directly measure the voltage of the contact bar in operation 208.

In one operational example of the diagnostic strategy 200, the contact bar may be closed, and a first voltage potential of the contact bar may be measured by the diagnostic module to confirm whether the contact bar is closed (e.g. near a full voltage of the battery 54 for arrangement within the circuit 50). The contact bar may then be opened, and a second voltage potential of the contact bar may be measured by the diagnostic module to confirm the contact bar is open (e.g. near 0V for arrangement in the circuit 50). By focusing on a voltage differential between a battery source side and the movable contact of the contact bar, an open/closed status of the contact bar may be detected regardless of whether the load side discharges sufficiently (e.g. the circuit 10 in which a load side connected to the contact bar may not discharge sufficiently).

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A contactor assembly comprising:
   a housing;
   an accessible contactor assembly component disposed within the housing;
   a contact bar electrically connected to the accessible contactor assembly component and translatable between an open and a closed position, wherein the accessible contactor assembly component is a frame, a shaft to translate the contact bar between the open and closed positions, a movable core, or a collar;
   a pair of coil terminals;
   a pair of power terminals;
   a diagnostic terminal arranged for electrical communication with the accessible contactor assembly component; and
   a module programmed to identify whether the contact bar is in the open or closed position responsive to detection of a voltage status of the diagnostic terminal.

2. The assembly of claim 1, wherein the open position is further defined as an electrically floating position in which the contact bar does not operate as an electrical conductor and the contact bar is disconnected from the pair of power terminals.

3. The assembly of claim 1 further comprising energy transferring power terminals in selective electrical communication with a battery and a load, wherein the contact bar includes a first connection region and a second connection region, each of the connection regions disposed on opposing ends of the contact bar to transfer current from the battery to the load when the contact bar is in the closed position.

4. The assembly of claim 1, wherein the contact bar and the accessible contactor assembly component are arranged with one another such that the module detects actual contact bar voltage status as to whether the contact bar is in the open or closed position regardless of a load side voltage.

5. The assembly of claim 1 further comprising a pull-down resistor mounted for electrical communication with the contact bar.

6. A vehicle contactor assembly comprising:
   a housing;
   a frame disposed within the housing;
   a coil disposed within the frame;
   first and second terminals extending out of the housing for selective electrical communication with the coil;
   third and fourth terminals extending out of the housing for selective electrical communication with a battery and a load;
   a translation unit disposed within and in electrical communication with the frame;
   a fifth terminal extending from within the housing and in electrical communication with the frame, wherein the frame is in electrical communication with the translation unit such that the fifth terminal and the contact bar have a same voltage;
   a contact bar mounted to the translation unit and oriented within the frame such that the contact bar translates between a first position in which the contact bar does not contact the third and fourth terminals and a second position in which the contact bar does contact the third and fourth terminals; and
   a diagnostic module in electrical communication with the frame and programmed to identify whether the contact bar is in the first position or the second position based on a voltage status of the fifth terminal regardless of a discharge level of the load of a circuit including the third and fourth terminals of a load side.

7. The assembly of claim 6 further comprising a pull-down or pull-up resistor for electrical communication with the contact bar.

8. The assembly of claim 7, wherein the pull-down resistor is in electrical communication with the contact bar and a ground potential of the battery or a series of battery cells.

9. The assembly of claim 7, wherein the pull-down or pull-up resistor is in electrical communication with the contact bar and an intermediate potential of a series of battery cells.

10. The assembly of claim 6, wherein the contact bar comprises first and second contact regions each disposed on one of two opposing ends of the contact bar, and wherein the translation unit is oriented within the frame such that the first contact region and the second contact region do not contact the third and fourth terminals when the contact bar is in the first position and both contact the third and fourth terminals when the contact bar is in the second position.

11. The assembly of claim 6, further comprising a pull-down resistor in electrical communication with the contact bar to selectively reduce a voltage of the contact bar to a voltage equal to approximately half of a voltage of a battery in at least partial electrical communication with the contact bar.

12. A method to diagnose a contactor status comprising:
positioning a moveable contact bar within a contactor assembly for electrical communication with a frame of the contactor assembly;
electrically connecting a diagnostic terminal to the frame;
arranging a diagnostic module for electrical communication with the diagnostic terminal;
directly measuring a voltage of the diagnostic terminal via the diagnostic module to identify whether the contact bar is in an open position or a closed position in which a circuit including the contact bar is complete.

13. The method of claim 12 further comprising arranging a pull-down resistor in electrical communication with the moveable contact bar to selectively reduce a voltage of the contact bar to a voltage equal to approximately half of a voltage of a battery in electrical communication with the moveable contact bar.

14. The method of claim 13, wherein with the pull-down resistor is in electrical communication with the moveable contact bar and a ground potential of a battery or a series of battery cells in electrical communication with the moveable contact bar.

* * * * *